(12) United States Patent
Huang et al.

(10) Patent No.: US 7,791,884 B2
(45) Date of Patent: Sep. 7, 2010

(54) MOTOR DRIVE WITH HEAT PIPE AIR COOLING

(75) Inventors: Bin Huang, Mississauga (CA); John C. Teeple, Brantford (CA); Reginald A. Drake, Bright (CA); Peter Janes, Cambridge (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 12/267,765

(22) Filed: Nov. 10, 2008

(65) Prior Publication Data

US 2010/0118493 A1    May 13, 2010

(51) Int. Cl.
    H05K 7/20    (2006.01)
(52) U.S. Cl. ............. 361/700; 361/679.47; 361/679.52; 361/699; 361/701; 165/104.21; 165/104.26; 165/104.33; 165/185; 363/22; 363/131; 363/141; 454/184
(58) Field of Classification Search ............ 361/679.46, 361/679.47, 679.52, 22, 306, 535, 690–697, 361/700, 724–727; 174/17 VA, 50; 454/184; 165/80.4, 104.21, 104.26, 104.33, 185, 240, 165/246; 702/130, 132, 182, 186; 700/299, 700/300; 363/27, 45, 65, 141, 144, 131, 363/132, 41, 71
See application file for complete search history.

(56) References Cited

U.S. PATENT DOCUMENTS 3,769,551 A * 10/1973 Corman et al. .............. 361/676

(Continued)

FOREIGN PATENT DOCUMENTS

JP    362152147 A  *  7/1987

(Continued)

OTHER PUBLICATIONS

Scan 12292009_165819, which is an English translation of the Japan Patent JP02002209391A.*

(Continued)

*Primary Examiner*—Michael V Datskovskiy
(74) *Attorney, Agent, or Firm*—Fay Sharpe LLP; Alexander R. Kuszewski; John M. Miller

(57) ABSTRACT

An air cooled switching unit for a motor drive includes a plurality electrical switches and a plurality of heat pipe assemblies. Each heat pipe assembly includes a thermally and electrically conductive evaporator, a condenser, and at least one heat pipe extending between the evaporator and condenser. Each of the switches is abutted with an evaporator of at least one of the heat pipe assemblies for conduction of both electrical power and heat between the switch and the evaporator. Each heat pipe assembly further includes an electrically conductive base abutted with the evaporator, and the air cooled switching unit further includes a plurality of power lugs each connected to a base of a respective one of the heat pipe assemblies for input or output of electrical power to the base and the evaporator plate abutted with the base. Each heat pipe assembly includes at least one evaporator defined by a metallic plate. The condenser of each heat pipe assembly includes a plurality of parallel spaced-apart cooling fins. The at least one heat pipe of each heat pipe assembly includes a sealed pipe containing a phase-change material for transferring heat from said evaporator to said condenser. The at least one heat pipe includes a first end located in the metallic plate and a second end in contact with and extending through the cooling fins of the condenser. A temperature feedback system derives air flow velocity through the condenser.

18 Claims, 10 Drawing Sheets

U.S. PATENT DOCUMENTS

| | | | |
|---|---|---|---|
| 3,852,805 A * | 12/1974 | Brzozowski | 257/715 |
| 3,852,806 A * | 12/1974 | Corman et al. | 257/715 |
| 4,036,291 A * | 7/1977 | Kobayashi et al. | 165/104.21 |
| 5,229,915 A * | 7/1993 | Ishibashi et al. | 361/699 |
| 5,245,527 A * | 9/1993 | Duff et al. | 363/131 |
| 5,637,918 A * | 6/1997 | Tatuta | 257/686 |
| 5,899,265 A * | 5/1999 | Schneider et al. | 165/104.33 |
| 6,822,866 B2 | 11/2004 | Fearing et al. | |
| 6,936,767 B2 | 8/2005 | Kleinecke et al. | |
| 7,088,583 B2 | 8/2006 | Brandon et al. | |
| 2002/0089056 A1 | 7/2002 | Eady et al. | |
| 2005/0077065 A1 | 4/2005 | Kleinecke et al. | |
| 2005/0252672 A1 | 11/2005 | Kleinecke et al. | |
| 2009/0065182 A1 * | 3/2009 | Takahashi et al. | 165/104.33 |

FOREIGN PATENT DOCUMENTS

| | | | |
|---|---|---|---|
| JP | 02001061282 A * | 3/2001 | |
| JP | 02002119059 A * | 4/2002 | |
| JP | 02002209391 A * | 7/2002 | |

OTHER PUBLICATIONS

Scan 12292009_170635, which is an English translation of the Japan Patent JP02001061282A.*

Scan 12292009_171229, which is an English translation of the Jappan Patent JP02002119059A.*

* cited by examiner

US 7,791,884 B2

MOTOR DRIVE WITH HEAT PIPE AIR COOLING

BACKGROUND

Motor drives are power conversion systems or "converters" that operate to provide power to electric motors in a controlled fashion to control one or more motor performance parameters, such as speed, torque, etc. Medium voltage current-sourced type motor drives typically receive multiphase AC input power in the range of about 2,400 to 6,900 volts, which is converted in a rectifier to DC power supplied to a DC link and provided from the DC link to an inverter. The inverter switches the DC link currents to provide AC output current to a motor load with the output current being controlled by the inverter in closed loop fashion to drive the motor at a desired speed and/or torque. The rectifier is generally an active switching type rectifier that selectively activates switches to provide current from the AC input to the DC link bus to achieve AC to DC power conversion, where the rectifier gain is controlled to provide a DC link current level at the peak current level required by the motor at any given time. The inverter, in turn, implements a switching scheme to selectively connect the motor leads to the DC link bus terminals to provide motor phase currents with controlled amplitudes, phase, and frequency to implement a particular motor control strategy based on motor performance feedback values and desired performance setpoints or profiles. Voltage source drives are similar but the DC link supplies a select constant DC voltage instead of a select constant DC current.

The rectifier and inverter switches are solid state devices such as, e.g., gate turnoff thyristors (GTOs), silicon controlled rectifiers (SCRs), insulated gate bipolar transistors (IGBTs), symmetrical gate commutated thyristors (SCGTs) or the like. Regardless of the exact type, these switches generate large amounts of heat that must be dissipated.

Commonly owned U.S. patent publication no. 2002/0089056A1 provides one example of such a motor drive, and the disclosure of said U.S. patent publication no. 2002/0089056A1 is hereby expressly incorporated into the present specification. U.S. patent publication no. 2002/0089056A1 discloses an air cooled motor drive wherein the switches of the rectifier and inverter are defined as "press-pack" switch devices mounted on respective printed circuit boards (PCBs). Each PCB includes a bracket adapted to be secured to a mounting location (such as a heat sink). When each PCB is operatively installed, the opposite terminals of its respective press-pack switch device are abutted with respective first and second heat sinks between which the PCB and switch are located for electrical and thermal conductivity between the heat sinks and the press-pack switch device, with electrical conductivity between the two heat sinks being controlled by the press-pack switch, itself. The heat sinks are electrically connected to power lugs which are, in turn, connected to power connectors for input or output of electrical power. The heat sinks are cooled by forced air flow generated by a fan or other source. For higher power applications, however, the heat sinks do not provide enough cooling. As such, a need has been found for such a motor drive with improved air cooling.

SUMMARY

In accordance with the present development, an air cooled switching unit for a motor drive includes a plurality electrical switches and a plurality of heat pipe assemblies. Each heat pipe assembly includes a thermally and electrically conductive evaporator, a condenser, and at least one heat pipe extending between the evaporator and condenser. Each of the switches is abutted with an evaporator of at least one of the heat pipe assemblies for conduction of both electrical power and heat between the switch and the evaporator.

In accordance with other aspects of the present development, each heat pipe assembly further includes an electrically conductive base abutted with the evaporator, and the air cooled switching unit further includes a plurality of power lugs each connected to a base of a respective one of the heat pipe assemblies for input or output of electrical power to the base and the evaporator plate abutted with the base. Each heat pipe assembly includes at least one evaporator defined by a metallic plate. The condenser of each heat pipe assembly includes a plurality of parallel spaced-apart cooling fins. The at least one heat pipe of each heat pipe assembly includes a sealed pipe containing a phase-change material such as water for transferring heat from said evaporator to said condenser. The at least one heat pipe includes a first end located in the metallic plate and a second end in contact with and extending through the cooling fins of the condenser.

In accordance with another aspect of the present development, a temperature feedback system is provided an enables air flow velocity through the condenser to be derived.

DETAILED DESCRIPTION

Figure 1:
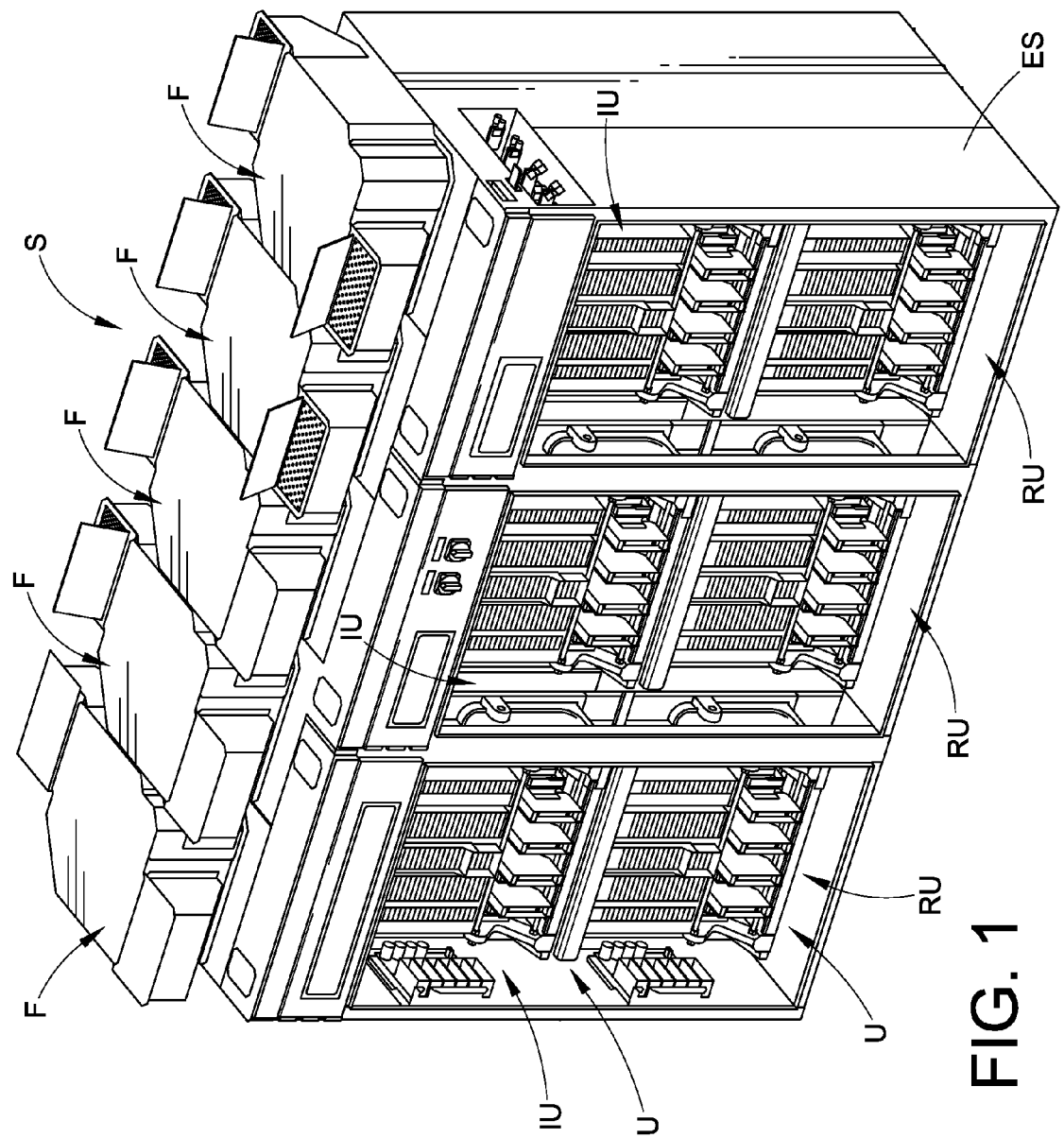
FIG. 1 is an isometric view of a drive or converter system including a plurality of air-cooled switching units formed in accordance with the present invention arranged to implement the rectifier and the inverter.

FIG. 1 is an isometric view of a drive system or converter system S including a plurality of air-cooled switching units formed in accordance with the present invention. The drive S is defined by a plurality (e.g. three as shown) of said switching units RU arranged as the rectifier electrically joined through a DC link as described above to a plurality (e.g., three as shown) of said switching units IU arranged as the inverter. The switching units RU,IU (which are generally referred to herein as switching units U) are housed within an enclosure ES for safety and other reasons, and one or more fan units F or other air flow means are provided for moving air through the enclosure E for cooling the switching units U as described below.

Figure 2A:
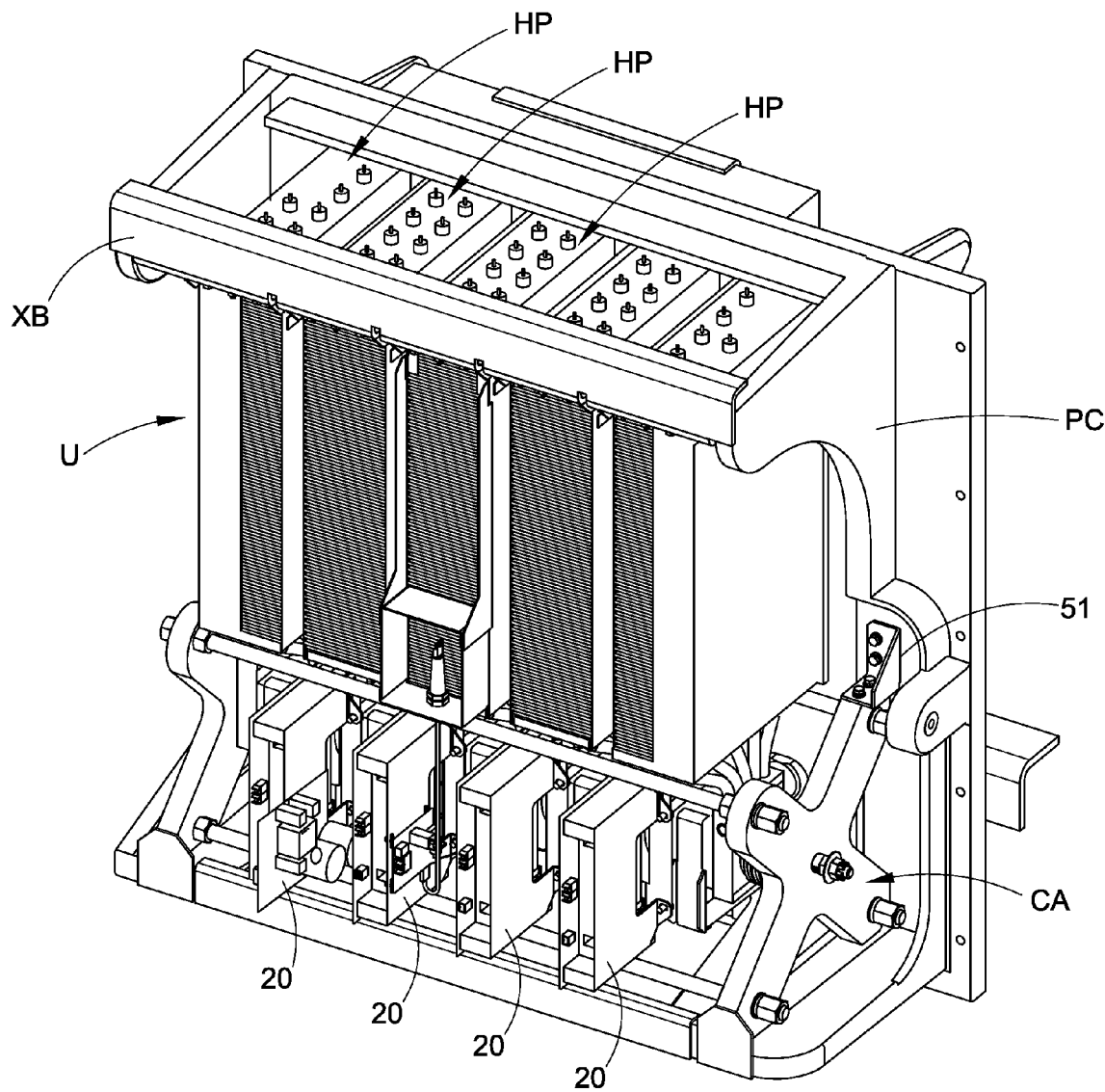
FIGS. 2A and 2B are respective front and rear isometric views of a single air-cooled switching unit in accordance with the present invention.
Figure 2B:
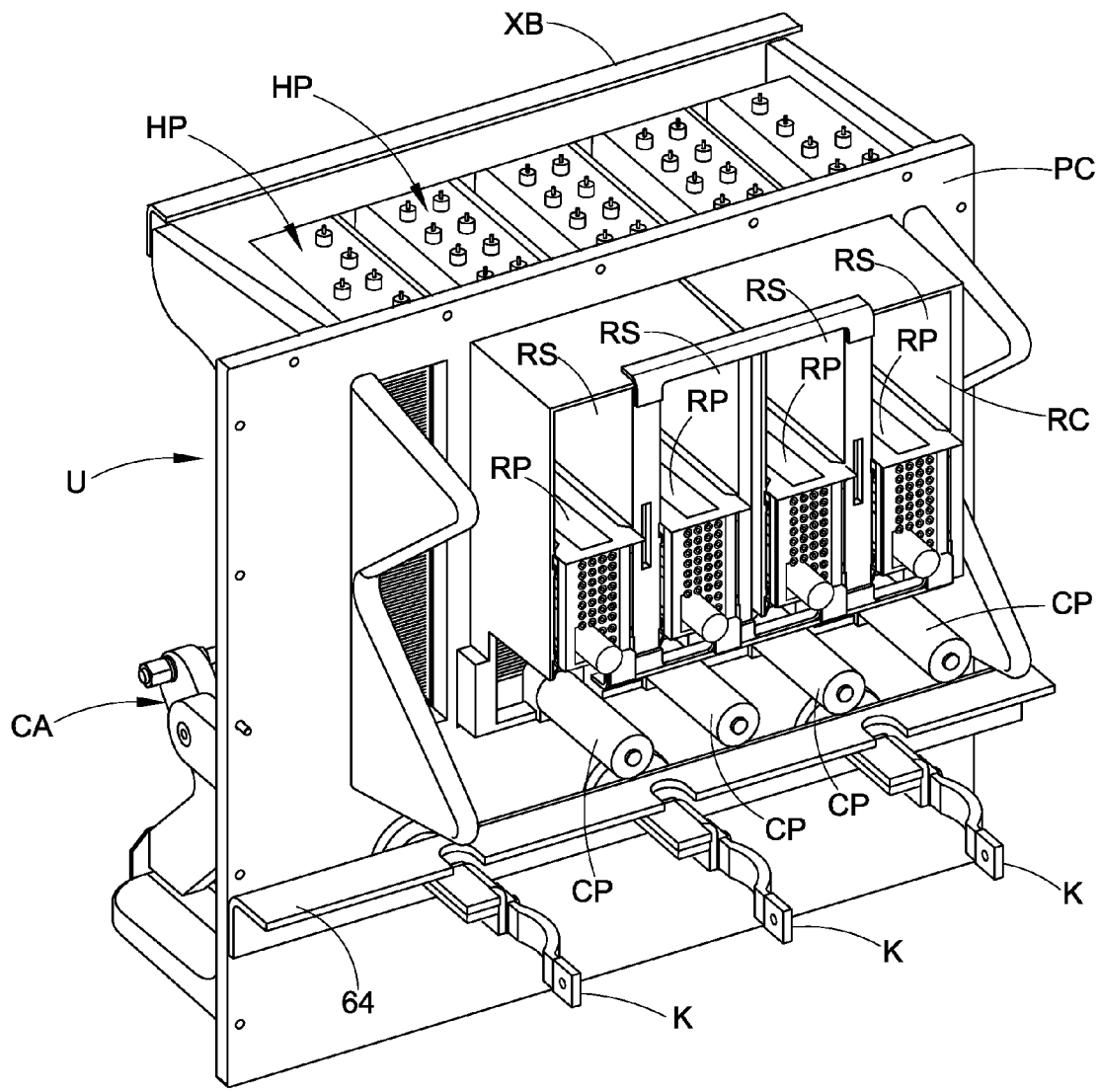

FIGS. 2A and 2B are respective front and rear isometric views of a single air-cooled switching unit U in accordance with the present invention. The unit U can be either a rectifier switching unit RU or an inverter switching unit IU, without departing from the scope and intent of the present invention. The switching unit U comprises a "power cage" frame or chassis PC defined as a one-piece or multi-piece construction from electrically non-conductive material. In the illustrated embodiment, the power cage PC is defined from epoxy resin, although other electrically non-conductive materials are contemplated. As described in further detail below, the power cage PC supports a plurality of heat pipe assemblies HP, a resistor cage RC, a plurality of power connectors K, and a plurality of switching printed circuit boards (PCBs) 20, each of which includes a switch device such as a press-pack semiconductor switch device 22 (FIGS. 3, 3A) connected thereto for switching currents in the rectifier or inverter of a motor drive as described above. A clamp assembly CA is fixedly secured to the power cage PC for clamping the switches 22 and heat pipe assemblies HP together for good electrical and thermal conduction as described in detail below.

Figure 3:
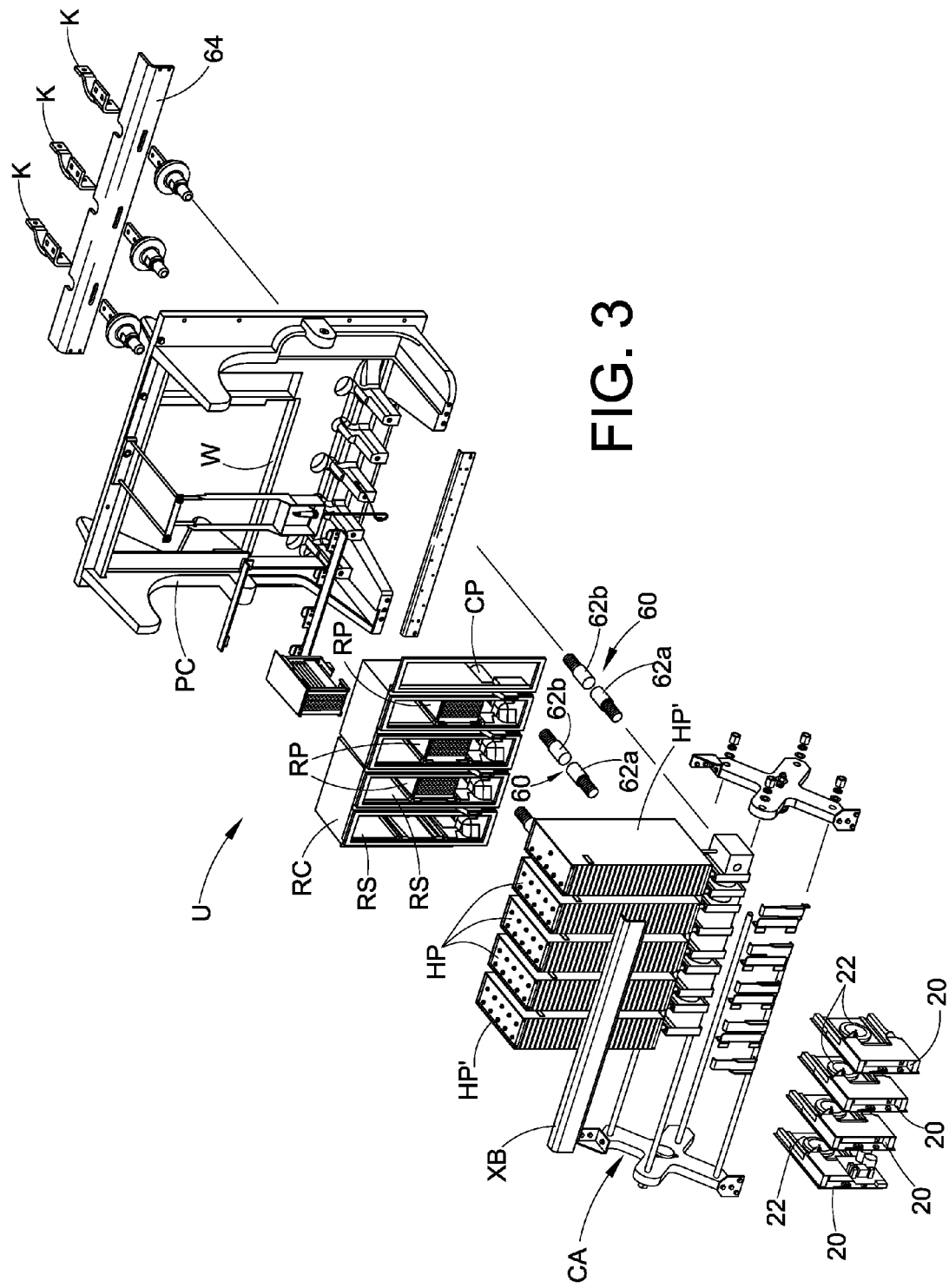
FIG. 3 is an exploded isometric view of the switching unit of FIG. 2A.
Figure 3A:
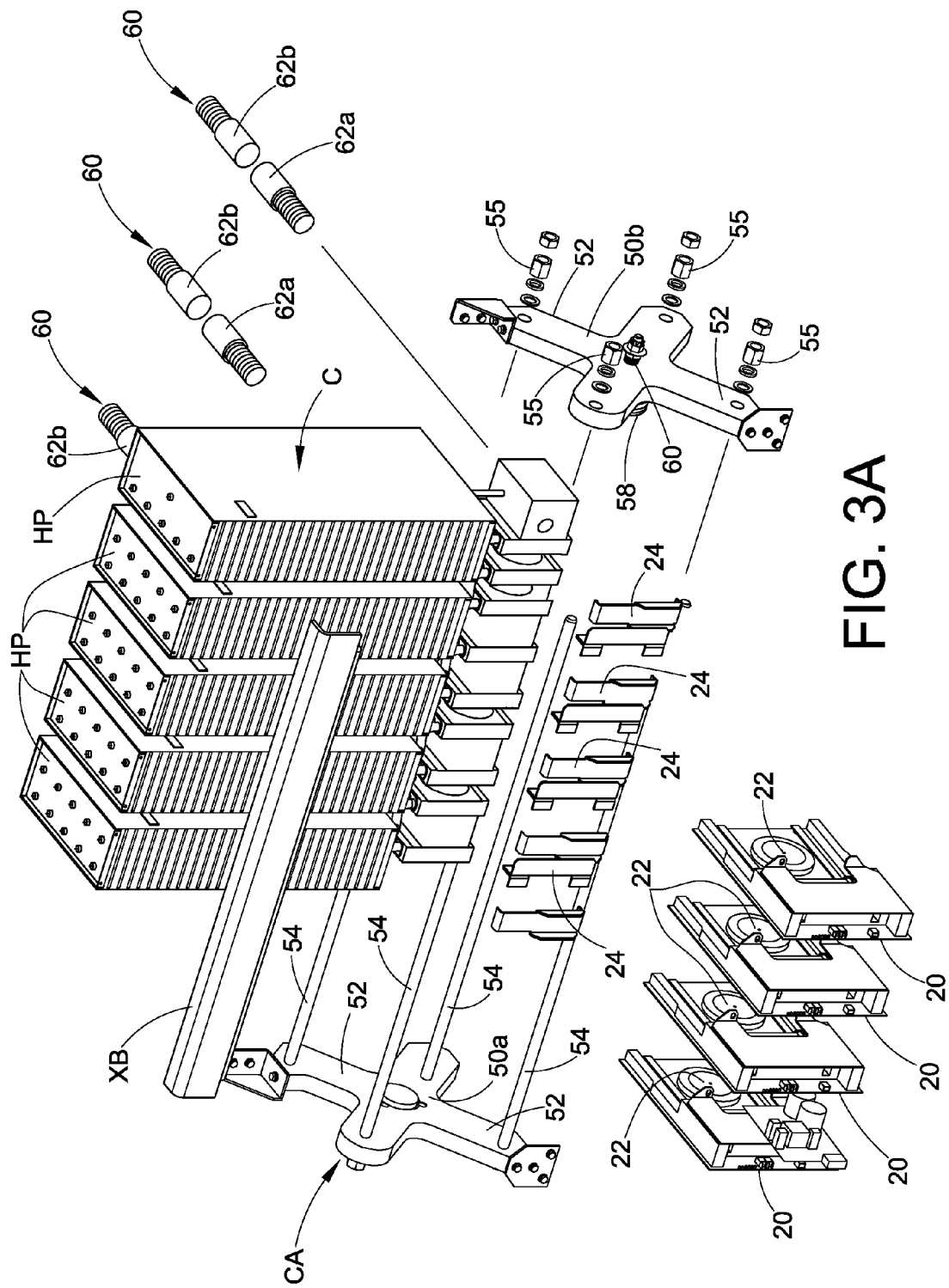
FIG. 3A is an enlarged portion of FIG. 3.

Referring specifically now to the exploded views shown in FIGS. 3 and 3A, it can be seen that the resistor cage RC, which is also defined from epoxy resin or other electrically non-conductive material, is received through a space or window W defined by the power cage PC and is secured to the power cage by fasteners or the like. The resistor cage RC comprises a plurality of resistor slots RS in which a plurality of resistor packs RP are respectively received. The slots RS are open front and rear to allow air flow therethrough to allow for cooling of the resistor packs RP held therein. The resistor cage RC also supports a plurality of capacitors CP. The resistor packs RP and capacitors C are used as snubbing circuits for suppressing transient voltage spikes.

Figure 5A:
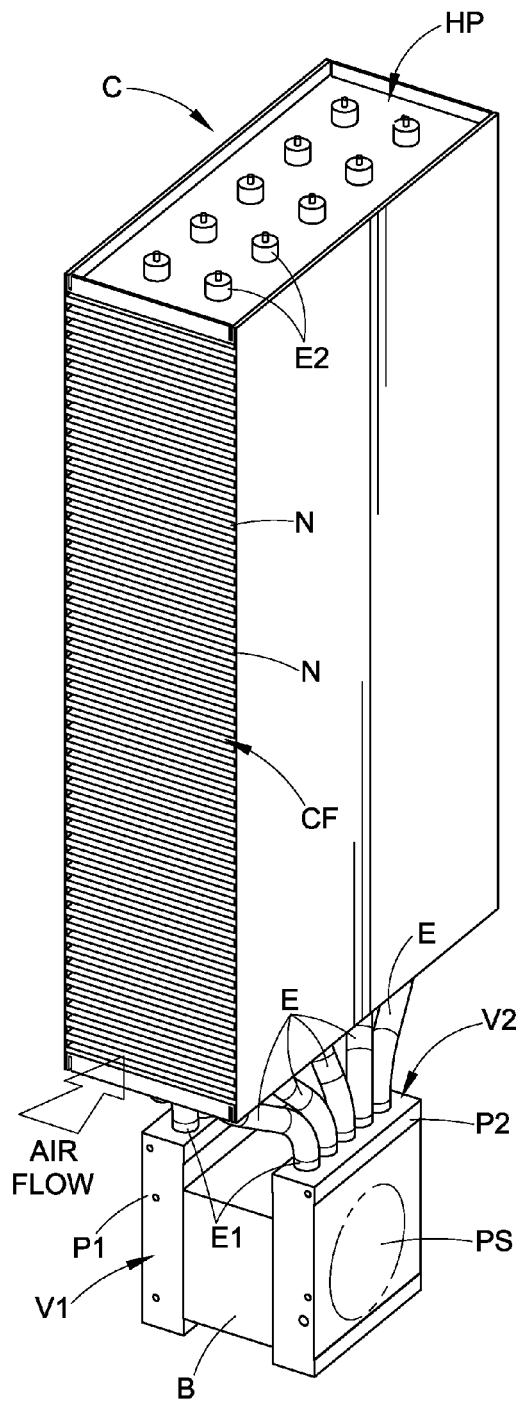
FIGS. 5A and 5B are front and rear isometric views of a heat pipe assembly used in a switching unit formed in accordance with the present invention, with first and second evaporator plates.
Figure 5B:
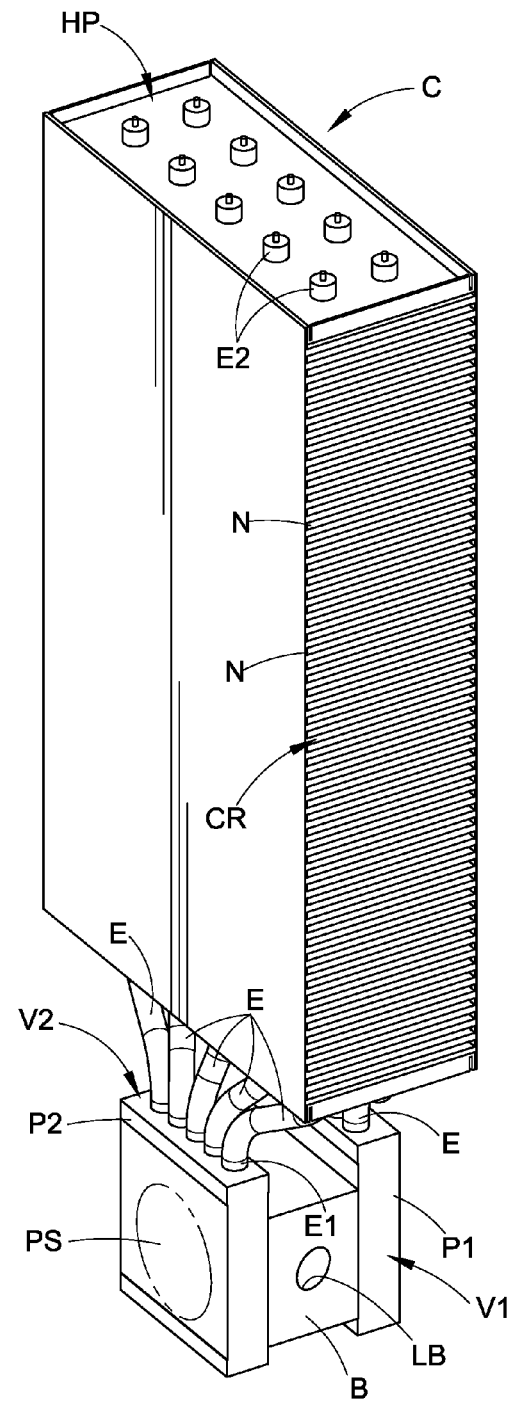
Figure 6A:
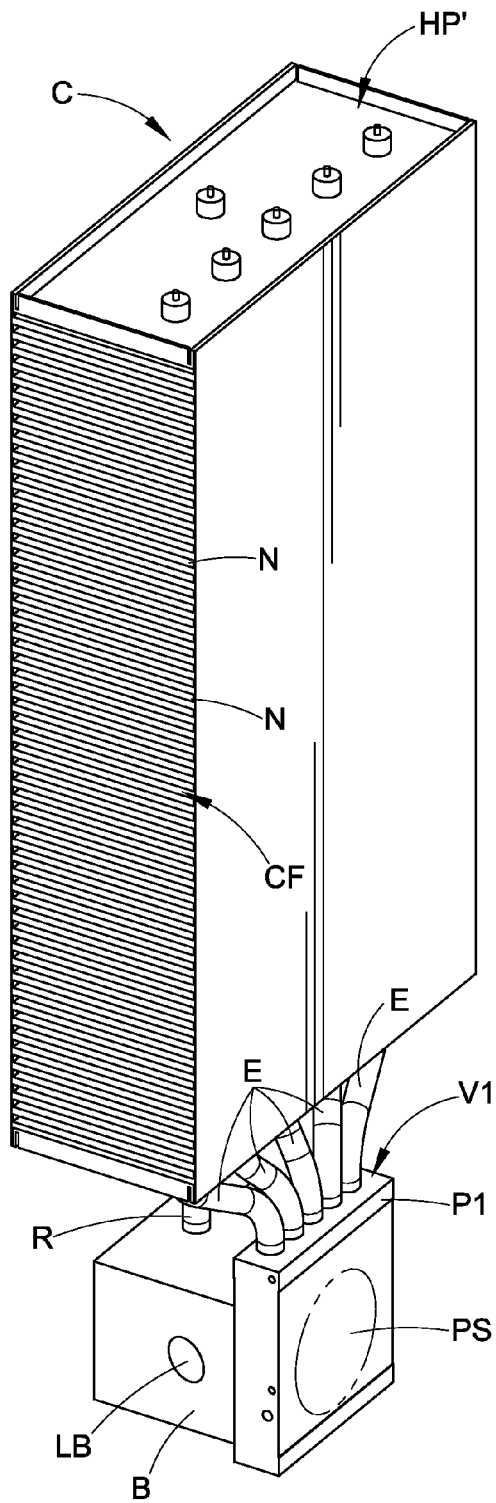
FIGS. 6A and 6B are similar to FIGS. 5A and 5B, respectively, but show a heat pipe assembly, with only a single evaporator plate.
Figure 6B:
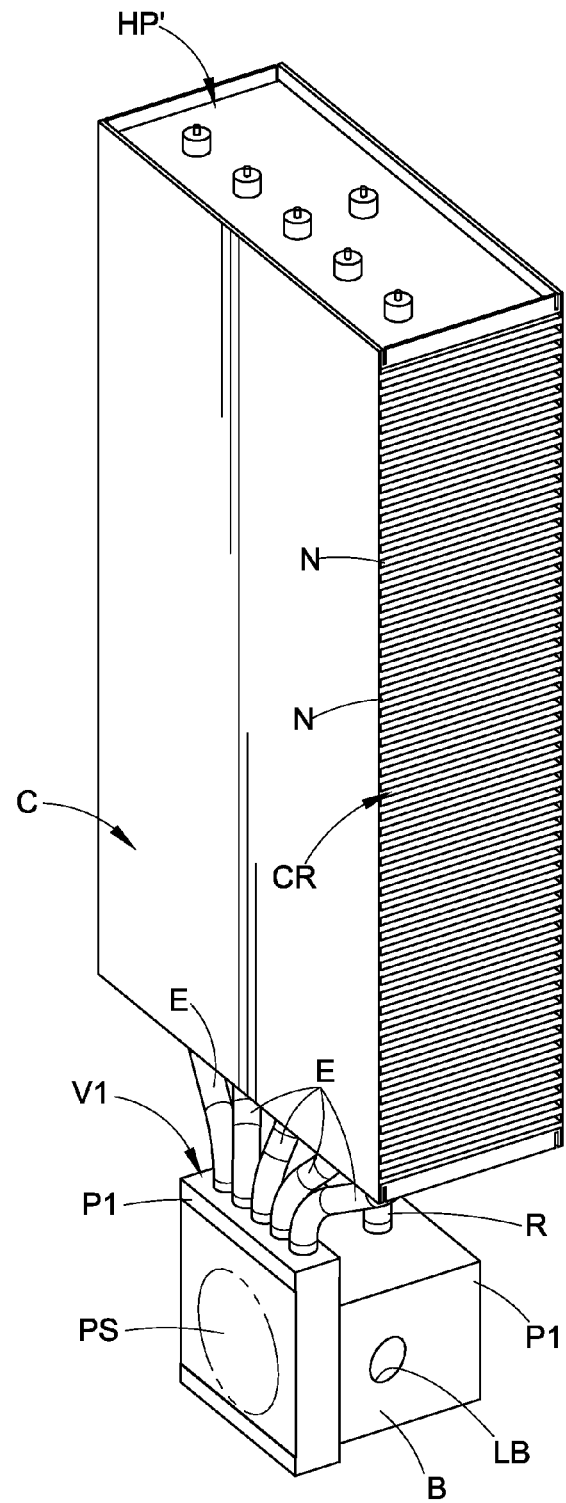

As noted, the plurality of heat pipe assemblies HP are supported by the power cage PC. FIGS. 5A and 5B are front and rear isometric views of a single heat pipe assembly HP including first and second evaporators V1,V2 comprising respective evaporator plates P1,P2; FIGS. 6A and 6B are front and rear isometric views of a heat pipe assembly HP' including only a single (first) evaporator V1 comprising a single evaporator plate P1. The heat pipe assembly HP includes a base B sandwiched between and abutted with the first and second (left and right) evaporator plates P1,P2. The base B and evaporator plates P1,P2 are all defined from electrically and thermally conductive material such as copper, brass, aluminum or the like, and the evaporator plates P1,P2 are in abutment with the base B for electrical and thermal conduction therebetween. In the illustrated example, the base B is defined from brass (as a one-piece or multi-piece construction) while the evaporator plates P1,P2 are defined from copper (each as a one-piece or multi-piece constructions). The base B includes a bore LB, typically threaded, for receipt of a power lug assembly that is, in turn, connected to one of the power connectors K for conduction of electrical power to/from the base B as described below. The heat pipe assembly HP includes a plurality of heat tubes or pipes E each having a first end E1 located inside an evaporator plate P1,P2 and a second end E2 spaced from (e.g., vertically above in the illustrated embodiment) the first end E1. Between the evaporator plate P1,P2 and the second end E2, each heat pipe E passes through a condenser C defined by a plurality of thermally conducting spaced-apart cooling fins N in contact with the heat pipes E. The condenser C is open at its front and rear CF,CR but closed on its lateral sides CL,CR to ensure that air flows through the condenser C between the cooling fins N from front CF to rear CR.

The heat pipe assembly HP' (FIGS. 6A,6B) is similar to the heat pipe assembly HP (FIG. 5A,5B), except that the heat pipe assembly HP' includes only one of the evaporator plates (labeled P1) as required for its location in the switching unit U, e.g., at the opposite ends of a series of the heat pipe assemblies HP. As shown, the heat pipe assembly HP' includes a support tube or rod R connected to the base B and the condenser C for supporting the condenser C relative to the base B. Otherwise, the heat pipe assembly HP' is identical to the heat pipe assembly HP. The heat pipe assembly HP' of FIGS. 6A,6B is a cost reduced version of the heat pipe assembly HP. As can be seen, e.g., in FIGS. 3 and 4, left and right heat pipe assemblies HP' are located respectively at left and right ends of a series of the heat pipe assemblies HP. Each cost reduced heat pipe assembly HP' contains functioning heat pipes E only for the single evaporator plate P1 located on only one (inwardly facing) side of the base B, and no functioning heat pipes for the opposite (outwardly facing) side of the base B not abutted with any of the electrical switches 22. The rod R can be a non-functional heat pipe tube, empty of working fluid with its only purpose being to support the condenser C or can have any other desired structure. This construction allows an economic advantage because fully functional heat pipes E are not required on both lateral sides of the base B as is required for the middle heat pipe assemblies HP.

Unlike prior art heat sink devices, the heat pipe assembly HP,HP' (referred to herein generally using the reference characters "HP") implements phase-change of a working fluid within each of the sealed heat pipes E to maximize heat transfer from evaporator V1,V2 to condenser C. In particular, each heat pipe or tube E is defined from copper, aluminum, or another metal or material with high thermal conductivity. Each heat pipe E is sealed after all fluids (gas and liquids) have been excluded therefrom, except that a small amount of a working fluid is introduced into each heat pipe E. In the present example, the working fluid is water, but other working fluids can be used, e.g., alcohol. Preferably, but not always, a wick structure is included inside each heat pipe E, along the entire length or only a portion of each heat pipe's length, e.g., a sintered metal structure, screen metal mesh, longitudinal or spiral grooves or any other known suitable wick structure. The wick provides a capillary driving force that ensures the condensate will return to the first end E1 of the pipe E in the evaporator V1,V2 after being condensed in the second end E2 of the pipe E located in the condenser C. In use, heat in an evaporator plates P1,P2 will vaporize working fluid in the first end E1 of a heat pipe E, and the vapor flows to the second end E2 of the heat pipe E in the condenser C, where the vapor is cooled and condenses. The condensed vapor flows by gravity and/or via capillary action in the optional wick back to the first end E1 of the pipe located in the evaporator plate P1,P2 for a repeat of the phase change cycle. Heat is thus transferred from the evaporator plate P1,P2 to the fins N of the condenser C, and the fins dissipate the heat to air flowing thereover.

Figure 4:
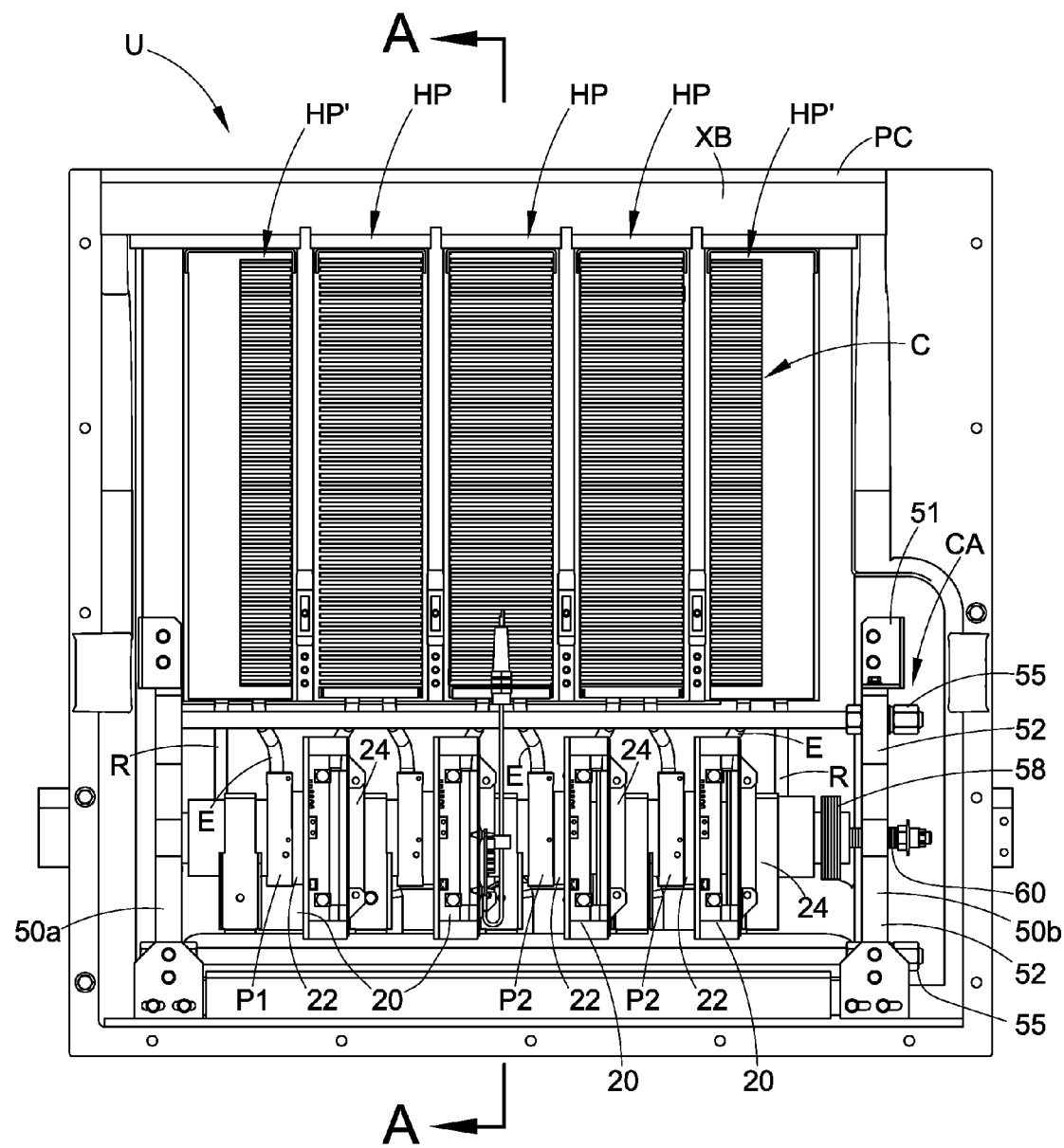
FIG. 4 is a front view of the switching unit of FIGS. 2A and 2B.

FIG. 4 is a front view of the switching unit U. There and in FIGS. 2A,2B,3, and 3A, it can be seen that the switching PCBs 20 are installed and secured to respective mounting brackets 24, each of which brackets 24 is secured to the base B and/or evaporator plate(s) P1,P2 of a heat pipe assembly HP,HP'. Each switching PCB includes at least one press-pack semiconductor switch device 22 as described above. When the switching PCBs 20 are operatively installed, each switch device 22 connected to a PCB 20 is located between and abutted with first and second evaporator plates P1,P2 of adjacent heat pipe assemblies HP,HP'. In particular, each switch device 22 has a first terminal abutted with an evaporator plate P1,P2 of a first heat pipe assembly HP,HP' and a second terminal abutted with an evaporator plate P1,P2 of a second heat pipe assembly HP,HP', and the switch device 22 controls the transmission of electrical power from one evaporator plate to the other. The clamp assembly CA is used to compress all of the aligned and abutted switch devices 22 and evaporator plates P1,P2 inward toward each other to ensure good thermal and electrical conductivity between each switch device 22 and the evaporator plates P1,P2 abutted therewith. Referring briefly again to FIGS. 5A,5B,6A,6B, each evaporator plate P1,P2 includes a switch mating surface PS that is preferably machined, polished and/or otherwise worked and/or conformed to optimize surface area contact with one of the PCB switch devices 22.

The clamp assembly CA comprises first and second end plates 50a,50b that are preferably X-shaped with four projecting arms 52. Four connecting rods 54 that extend between and interconnect the end plates 50 at the distal ends of corresponding aligned arms 52. In one example, the connecting rods 54 are molded into or otherwise permanently connected to one of the end plates 50a, while opposite ends of the connecting rods 54 are threaded and extend through the opposite end plates 50b. Mating fasteners 55 are connected to the threaded connecting rod ends to secure the opposite end plate 50b to the connecting rods 54. Alternatively, the connecting rods 54 are threaded at both ends and attached to the end plates 50a,50b using fasteners 55 advanced onto their threaded ends. At least the end plate 50b includes a clamp 58 connected thereto and adapted to engage the base B of the adjacent heat pipe assembly HP' to urge same away from the end plate 50b. The clamp 58 is connected to the end plate 50b and can be extended or retracted, e.g., by a selectively extensible and retractable threaded shaft 60 or other means, to control the clamping force exerted on the base B in contact therewith and consequently on the entire series of switches 22 and the evaporator plates P1,P2 abutted therewith. The clamp assembly CA itself, is fixedly secured to the power cage PC by one or more brackets 51 connected between the end plates 50a,50b and the power cage PC. The power cage PC includes one or more cross-braces XB connected between opposite lateral end plates 50a,50b thereof for supporting and/or capturing the heat pipe assemblies HP,HP' to the power cage. The X-shaped first and second end plates 50a,50b and four connecting rods 54 that extend between and interconnect the end plates 50 at the distal ends of corresponding aligned arms 52 provide excellent stability and rigidity without obstructing air flow or access to the switching PCBs 20 and other components.

Figure 4A:
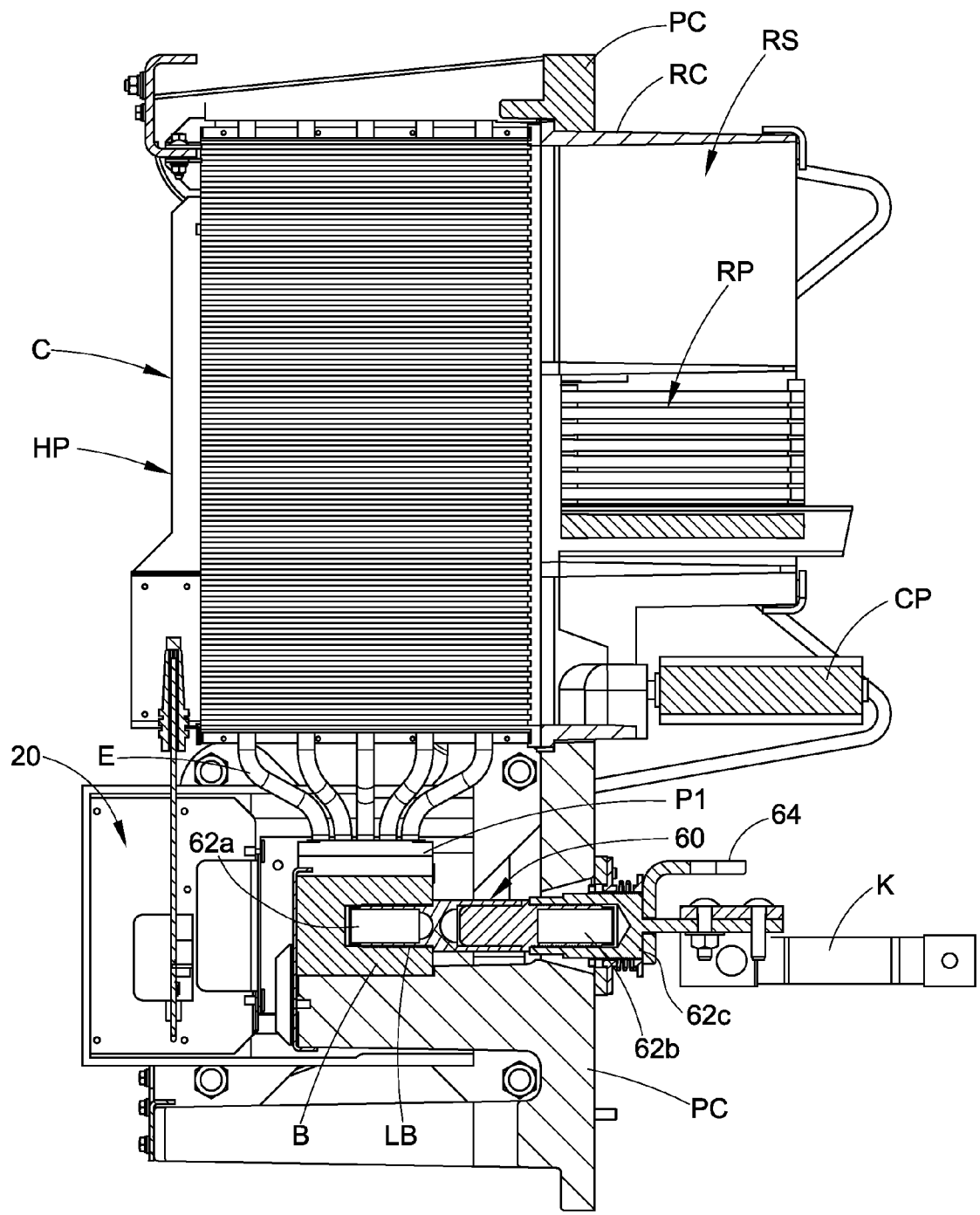
FIG. 4A is a cross-sectional view as taken at view line A-A of FIG. 4.

Each switching unit U includes at least three power lug assemblies 60 connected to respective bases B of the heat pipe assemblies HP,HP'. Each power lug assembly 60 is connected to a corresponding power connector K for input or output of electrical power to/from the power lug assembly 60 and the base B connected thereto. Referring to FIG. 4A, in the illustrated embodiment, a first portion 62a of each power lug assembly 60 is press-fit or threaded into the bore LB of the base B, a second portion 62b is connected to the first portion 62a by a threaded or press-fit connection, and a third portion 62c is connected to the second portion 62b by a press-fit or threaded connection. Each connector K is connected to the third portion 62c of a respective power lug assembly 60. A non-conductive bus support 64 extends between and supports the power lug assemblies 60 and connectors K.

Those of ordinary skill in the art will recognize that heat from the switches 22 will be conducted to the heat pipe evaporator plates P1,P2 in contact therewith, thus causing thermal transfer in the heat pipes E from the evaporator plates P1,P2 to the condenser C, which is cooled by airflow through the condenser C from front CF to rear CR between the cooling fins N to dissipate heat from the condenser. The heat pipe assemblies HP,HP' transfer more heat from the switches 22 as compared to prior heat sink devices not including heat pipes E containing working fluid for phase change heat transfer as described above. Furthermore, airflow exiting the rear CR of each condenser C flows downstream through the resistor slots RS of the resistor cage RC to cool the resistor packs RP contained therein before exiting the enclosure E.

Figure 7:
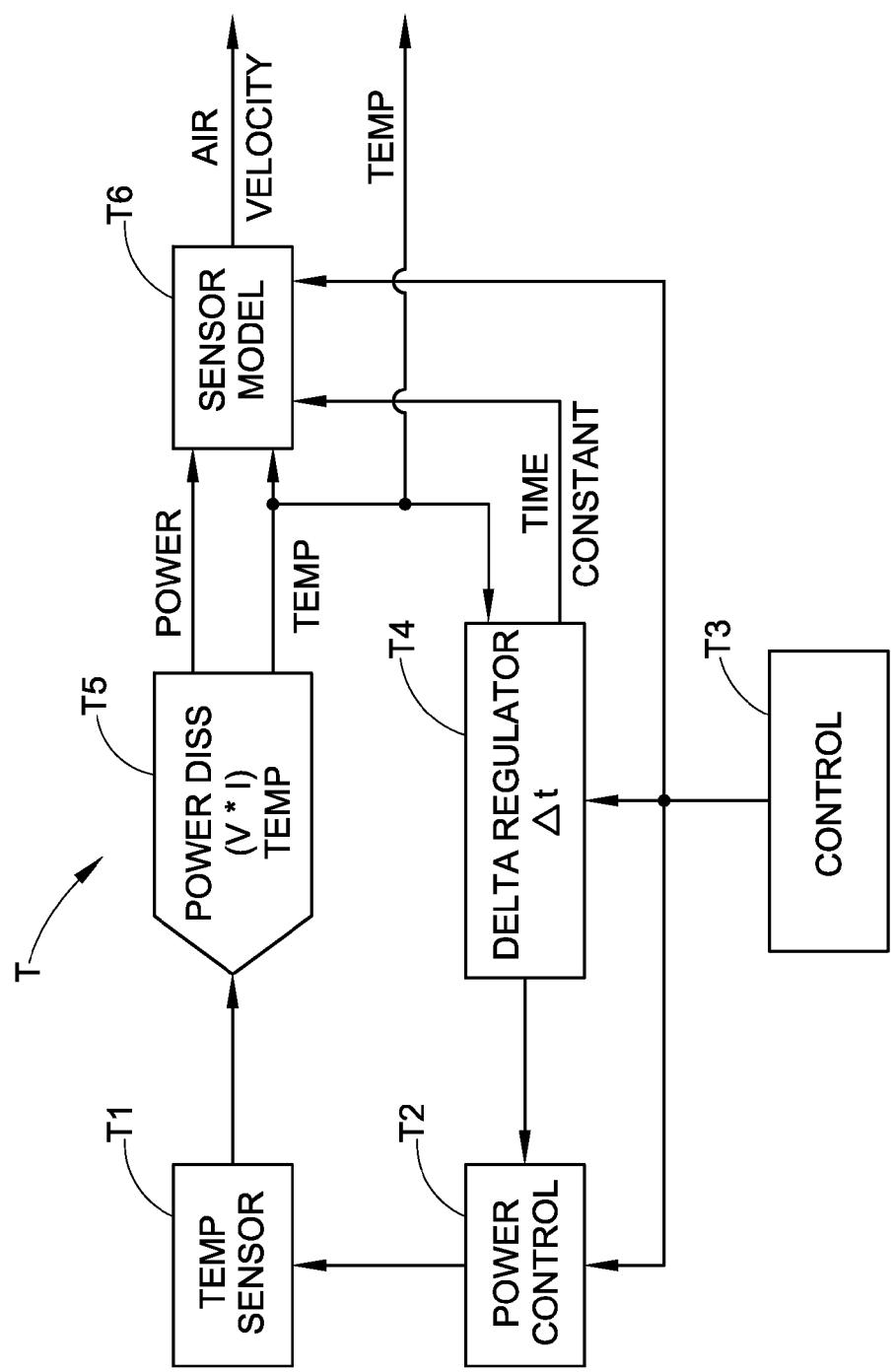
FIG. 7 illustrates a temperature feedback system of a switching unit formed in accordance with the present invention.

Each switching unit U comprises a temperature feedback system for monitoring the temperature of the air flowing through each condenser C, and also for deriving the velocity of the air flow from the temperature measurements. As shown in FIG. 7, the temperature feedback system T comprises various hardware and software components. In particular, a temperature sensor T1 is located within or adjacent one of the condensers C, e.g., located between the cooling fins N of the condenser C of a centrally located one of the heat pipe assemblies HP. The temperature sensor T1 is controlled by a power control unit T2 that powers the temperature sensor in response to control signals received from a main control system T3 and a delta regulator T4. The temperature sensor T1 outputs a signal to a temperature/power unit T5, such as an analog-to-digital converter, which derives and outputs: (i) the power dissipated by the temperature sensor; and, (ii) the temperature measured by the temperature sensor, both of which are output to a sensor model T6 that derives and outputs the magnitude of the air velocity flowing through the condenser. In one example, main control system T3, the delta regulator T4, and sensor model T6 are all implemented via software programmed into general purpose or application specific microprocessors or other programmable hardware circuits and devices.

The temperature sensor T1 can be any desired temperature sensor that uses change in resistance/conductivity to measure temperature and that can also be self-heated by increasing current flow therethrough. Examples include a resistance temperature detector (RTD) or a pn-junction semiconductor temperature sensor.

In use, the power control unit T2 operates the temperature sensor T1 alternatively in two different modes: (i) an ambient mode for sensing the ambient temperature (t) of the air contacting the sensor; and (ii) a heated mode in which the power control unit T2 powers the sensor T1 with increased power so that the sensor becomes heated to a select temperature above the measured ambient temperature, with the difference between the ambient temperature and heated temperature being referred to as (Δt). In one example, Δt=5° C. to 10° C. above ambient temperature t. The power control unit switches between ambient mode and heated mode at a rate that will vary depending upon the type of sensor and air velocity but will generally be in the range of about 0.2 Hertz (Hz) in still air and around 5 Hertz (Hz) at full air flow.

The output of the temperature sensor, in both the ambient mode and heated mode is output to the temperature/power unit T5 which derives the temperature (TEMP) in both the ambient mode and the heated mode, and the power dissipated (POWER) through the temperature sensor T1 (e.g., in terms of watts W as a product of voltage (V) and current (I) W=V*I). These TEMP and POWER values are input to the sensor model T6 which derives air velocity flowing past the temperature sensor T1, based upon the amount of power required to heat the sensor by Δt degrees. As air velocity moving past the sensor increases, greater power is required to heat the sensor and vice versa. This relationship is implemented in the model T6 to derive air velocity in terms of feet per minute based upon the ambient temperature measured in ambient mode and power dissipated in the heated mode. The air velocity derived by the sensor model T6 is output to a main control system for the drive/converter system S so that the drive/converter system S can be disabled or otherwise controlled if the air velocity decreases below a minimum threshold.

It should be noted that the target Δt might not be reached in cases of either: (i) high air velocity; or (ii) low power available to the temperature sensor. This does not affect the system because the actual Δt achieved is used to derive the air velocity in the sensor model T6. If the temperature sensor T1 is implemented as an RTD or the like, the power control unit is implemented to supply the sensor with an excitation voltage that varies for ambient mode and heated mode. If the temperature sensor T1 is implement using a pn-junction or other silicon transistor, the power control unit T2 can be implemented as a switch to enable or disable collector voltage and a circuit to provide a known base bias current for temperature measurement and a path for variable base drive to allow for increased current flow for heating the temperature sensor (i.e., the semiconductor temperature sensor itself is used regulates its own heating). Regardless of the type of temperature sensor T1, the delta regulator T4 via power control unit T2 attempts to maintain a specific Δt between the ambient temperature measurement and the heated temperature measurement. The actual power dissipated and actual Δt achieved, along with measured time constant values are fed into the sensor model T6 which uses these values to calculate the air velocity at the sensor location from 0 up to at least 2000 feet per minute.

The firmware of the converter system S independently calculates the airflow based on the area of the heat sink. The switching unit U can be disabled if air velocity decreases below a required threshold and/or if the ambient temperature increases above a select threshold. It should be noted that the use of Δt rather than a preselected heated temperature minimizes the chance of burning out the temperature sensor T1 in cases where air velocity is zero or low. Also, the temperature feedback system T is able to operate with minimal power, e.g., 24 volts @10 milliamps (mA) as is required in the switching unit.

The development has been described with reference to preferred embodiments. Those of ordinary skill in the art will recognize that modifications and alterations to the preferred embodiments are possible. The disclosed preferred embodiments are not intended to limit the scope of the following claims, which are to be construed as broadly as possible, whether literally or according to the doctrine of equivalents.

The invention claimed is:

1. An air cooled switching unit for a motor drive, said switching unit comprising:
   a plurality electrical switches;
   a plurality of heat pipe assemblies, each heat pipe assembly comprising:
      a thermally and electrically conductive evaporator;
      a condenser;
      at least one heat pipe extending between the evaporator and condenser;
   wherein each of said switches is abutted with an evaporator of at least one of said heat pipe assemblies for conduction of both electrical power and heat between said switch and said evaporator; and,
   wherein each heat pipe assembly further comprises an electrically conductive base abutted with the evaporator, said air cooled switching unit further comprising a plurality of power lugs each connected to a base of a respective one of said heat pipe assemblies for input or output of electrical power to said base and said evaporator plate abutted with said base;
   said switching unit further comprising:
   a clamp assembly for compressing each of said electrical switches and evaporators together for ensuring maximum electrical and thermal conduction between each switch and evaporator abutted therewith, said clamp assembly comprising first and second end plates located on opposite ends of an abutted series of said switches and evaporators, said end plates connected by a plurality of connecting rods that extend therebetween, said clamp assembly further comprising an adjustable clamp connected to one of said end plates and adapted to exert a clamping force on said base of an adjacent one of said heat pipe assemblies, wherein said first and second end plates each comprise projecting arms arranged in an X-shape, and wherein said connecting rods extend between and interconnect respective distal ends of aligned arms.

2. An air cooled switching unit for a motor drive, said switching unit comprising:
   a plurality electrical switches;
   a plurality of heat pipe assemblies, each heat pipe assembly comprising:
      a thermally and electrically conductive evaporator;
      a condenser; and
      at least one heat pipe extending between the evaporator and condenser;
   wherein each of said switches is abutted with an evaporator of at least one of said heat pipe assemblies for conduction of both electrical power and heat between said switch and said evaporator; and,
   wherein each heat pipe assembly further comprises an electrically conductive base abutted with the evaporator, said air cooled switching unit further comprising a plurality of power lugs each connected to a base of a respective one of said heat pipe assemblies for input or output of electrical power to said base and said evaporator plate abutted with said base; and
   wherein each of said plurality of heat pipe assemblies is supported by an electrically non-conductive power cage, and said switching unit further comprises an electrically non-conductive resistor cage located in an opening of the power cage, wherein said resistor cage comprises a plurality of slots open front and rear and a resistor pack located in at least some of said plurality of slots, said open front and rear of each of said slots of said resistor cage located in alignment with a respective one of said heat pipe assembly condensers to receive downstream airflow from said respective condenser, and wherein said switching unit further comprises a clamp assembly fixedly secured to said power cage, said clamp assembly adapted to compress each of said electrical switches and evaporators together for ensuring maximum electrical and thermal conduction between each switch and evaporator abutted therewith.

3. The air cooled switching unit as set forth in claim 2, wherein each of said plurality of electrical switches is a press-pack semiconductor switch device connected to a respective switching printed circuit board, wherein each of said printed circuit boards is physically fixedly secured to at least one of said heat pipe assemblies.

4. The air cooled switching unit as set forth in claim 2, wherein each of said plurality of electrical switches is a press-pack semiconductor switch device connected to a respective switching printed circuit board, wherein each switching circuit board is installed between adjacent first and second ones of said heat pipe assemblies, with opposite first and second terminals of said switch device physically abutted with respective first and second evaporators of said first and second heat pipe assemblies for electrical and thermal conduction between said first and second terminals and said first and second evaporators.

5. The air cooled switching unit as set forth in claim 2, wherein the evaporator of each heat pipe assembly comprises a metallic plate, said condenser comprises a plurality of parallel spaced-apart cooling fins, and said at least one heat pipe comprises a plurality of heat pipes each comprising a first end located in said metallic plate and a second end in contact with and extending through said cooling fins of said condenser, wherein each heat pipe is sealed and contains a phase-change material for transferring heat from said evaporator to said condenser.

6. The air cooled switching unit as set forth in claim 2, wherein at least one of said heat pipe assembly comprises first and second evaporators defined by respective first and second metallic plates, said condenser comprises a plurality of parallel spaced-apart cooling fins, and said at least one heat pipe comprises a plurality of heat pipes each comprising a first end located in either said first metallic plate or said second metallic plate and a second end in contact with and extending through said cooling fins of said condenser, wherein each heat pipe is sealed and contains a phase-change material for transferring heat from said evaporator to said condenser.

7. The air cooled switching unit as set forth in claim 6, wherein said first and second metallic plates are electrically connected through a metallic base with which both said first and second metallic plates are abutted.

8. The air cooled switching unit as set forth in claim 7, wherein at least one of said plurality of switches is abutted with first and second evaporators of respective first and second ones of said plurality of heat pipe assemblies for conduction of both electrical power and heat between the at least one switch and both of said first and second evaporators.

9. The air cooled switching unit as set forth in claim 8, wherein said phase-change material comprises water.

10. An air cooled switching unit for a motor drive, said switching unit comprising:
a plurality electrical switches;
a plurality of heat pipe assemblies, each heat pipe assembly comprising:
 a thermally and electrically conductive evaporator;
 a condenser; and
 at least one heat pipe extending between the evaporator and condenser;
wherein each of said switches is abutted with an evaporator of at least one of said heat pipe assemblies for conduction of both electrical power and heat between said switch and said evaporator; and,
wherein each heat pipe assembly further comprises an electrically conductive base abutted with the evaporator, said air cooled switching unit further comprising a plurality of power lugs each connected to a base of a respective one of said heat pipe assemblies for input or output of electrical power to said base and said evaporator plate abutted with said base;
said switching unit further comprising:
a temperature feedback system comprising:
a temperature sensor connected to and powered by a power control unit, said temperature sensor measuring an ambient temperature of air contacting the temperature sensor based upon power dissipated by said temperature sensor when said temperature sensor is operated in an ambient mode by said power control unit;
means for selectively operating the temperature sensor in a heated mode in which the power control unit powers said sensor with increased power to heat the sensor by a select amount Δt;
means for using the magnitude of power dissipated by said temperature sensor in said heated mode and for using Δt to derive a magnitude of air velocity of said air contacting said sensor.

11. The air cooled switching unit as set forth in claim 10, further comprising a clamp assembly for compressing each of said electrical switches and evaporators together for ensuring maximum electrical and thermal conduction between each switch and evaporator abutted therewith.

12. The air cooled switching unit as set forth in claim 10, wherein said temperature sensor comprises either an RTD or a pn-junction semiconductor.

13. The air cooled switching unit as set forth in claim 12, wherein said temperature sensor is located in said condenser.

14. The air cooled switching unit as set forth in claim 10, wherein said power control unit periodically switches said temperature sensor between said ambient mode and said heated mode.

15. The air cooled switching unit as set forth in claim 14, wherein said power control unit switches said temperature sensor between said ambient mode and said heated mode at a rate of 0.2 Hertz (Hz) to 5 Hertz (Hz).

16. An air cooled switching unit for a motor drive, said switching unit comprising:
a plurality electrical switches;
a plurality of heat pipe assemblies, each heat pipe assembly comprising:
 a thermally and electrically conductive evaporator;
 a condenser; and
 at least one heat pipe extending between the evaporator and condenser;
wherein each of said switches is abutted with an evaporator of at least one of said heat pipe assemblies for conduction of both electrical power and heat between said switch and said evaporator; and,
a temperature feedback system comprising:
a temperature sensor connected to and powered by a power control unit, said temperature sensor measuring an ambient temperature of air contacting the temperature sensor based upon power dissipated by said temperature sensor when said temperature sensor is operated in an ambient mode by said power control unit;
means for selectively operating the temperature sensor in a heated mode in which the power control unit powers said sensor with increased power to heat the sensor by a select amount Δt;
means for using the magnitude of power dissipated by said temperature sensor in said heated mode and using Δt to derive a magnitude of air velocity of said air contacting said sensor.

17. The air cooled switching unit as set forth in claim 16, further comprising a clamp assembly for compressing each of said electrical switches and evaporators together for ensuring maximum electrical and thermal conduction between each switch and evaporator abutted therewith.

18. The air cooled switching units as set forth in claim 17, wherein said clamp assembly comprises first and second end plates located on opposite ends of an abutted series of said switches and evaporators, said end plates connected by a plurality of connecting rods that extend therebetween, said clamp assembly further comprising an adjustable clamp connected to one of said end plates and adapted to exert a clamping force on said base of an adjacent one of said heat pipe assemblies.

* * * * *